US012712337B2

(12) United States Patent
Halbritter

(10) Patent No.: US 12,712,337 B2
(45) Date of Patent: Aug. 18, 2026

(54) LASER LIGHT SOURCE AND LIDAR SYSTEM COMPRISING THE LASER LIGHT SOURCE

(71) Applicant: OSRAM Opto Semiconductors GmbH, Regensburg (DE)

(72) Inventor: Hubert Halbritter, Dietfurt-Toeging (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 1083 days.

(21) Appl. No.: 17/783,687

(22) PCT Filed: Dec. 3, 2020

(86) PCT No.: PCT/EP2020/084484
§ 371 (c)(1),
(2) Date: Jun. 9, 2022

(87) PCT Pub. No.: WO2021/115922
PCT Pub. Date: Jun. 17, 2021

(65) Prior Publication Data

US 2023/0016296 A1 Jan. 19, 2023

(30) Foreign Application Priority Data

Dec. 10, 2019 (DE) ..................... 10 2019 133 797.6

(51) Int. Cl.
*H01S 5/42* (2006.01)
*G01S 7/481* (2006.01)
(Continued)

(52) U.S. Cl.
CPC ............ *H01S 5/423* (2013.01); *G01S 7/4814* (2013.01); *H01S 5/041* (2013.01); *H01S 5/042* (2013.01);
(Continued)

(58) Field of Classification Search
CPC ....... H01S 5/0622; H01S 5/4006; H01S 5/423
See application file for complete search history.

(56) References Cited

U.S. PATENT DOCUMENTS 4,677,629 A * 6/1987 Lesh ..................... H01S 5/4006 372/18
4,751,705 A 6/1988 Hadley et al.
(Continued)

FOREIGN PATENT DOCUMENTS

CN 101273503 A 9/2008
CN 102290706 A 12/2011
(Continued)

OTHER PUBLICATIONS

International Search Report issued for the corresponding International Application No. PCT/EP2020/084484, dated Mar. 5, 2021, 6 pages (for informational purposes only).
(Continued)

*Primary Examiner* — Michael Carter
(74) *Attorney, Agent, or Firm* — VIERING, JENTSCHURA & PARTNER MBB

(57) ABSTRACT

The invention relates to a laser light source (10), comprising an arrangement (120) of surface-emitting semiconductor lasers (1251, 1252, . . . **125*n*) to which a voltage is applied such that an operating current is below the threshold current and an intrinsic emission of the surface-emitting semiconductor laser is prevented. The laser light source also comprises a first semiconductor laser (100) which emits radiation (110**) that enters the surface-emitting semiconductor laser such that induced emission takes place via the injection locking mechanism and the individual surface-emitting semiconductor lasers emit laser light having the same wavelength and polarisation direction as the irradiated radiation
(Continued)

(110). The emission frequency of the first semiconductor laser can be changed by changing the operating current.

10 Claims, 6 Drawing Sheets

(51) Int. Cl.

| | |
|---|---|
| ***H01S 5/04*** | (2006.01) |
| ***H01S 5/042*** | (2006.01) |
| ***H01S 5/062*** | (2006.01) |
| ***H01S 5/183*** | (2006.01) |
| ***H01S 5/40*** | (2006.01) |

(52) U.S. Cl.
CPC ........ *H01S 5/0622* (2013.01); *H01S 5/18394* (2013.01); *H01S 5/4006* (2013.01)

(56) References Cited

U.S. PATENT DOCUMENTS

| | | | | |
|---|---|---|---|---|
| 5,331,654 | A * | 7/1994 | Jewell | H01S 5/18355 372/18 |
| 6,195,381 | B1 * | 2/2001 | Botez | H01S 5/12 372/96 |
| 6,282,214 | B1 | 8/2001 | Goto et al. | |
| 6,320,893 | B1 | 11/2001 | Ueki | |
| 2002/0048292 | A1 | 4/2002 | Bissinger et al. | |
| 2002/0122308 | A1 * | 9/2002 | Ikeda | H01S 5/0427 362/259 |
| 2003/0103534 | A1 | 6/2003 | Braiman et al. | |
| 2003/0169485 | A1 | 9/2003 | Ghislotti et al. | |
| 2004/0190582 | A1 | 9/2004 | Brick et al. | |
| 2006/0215714 | A1 * | 9/2006 | Luo | H01S 3/13 372/24 |
| 2007/0263683 | A1 | 11/2007 | Nakahata | |
| 2008/0197289 | A1 | 8/2008 | Muller | |
| 2009/0219957 | A1 | 9/2009 | Steegmueller et al. | |
| 2011/0304853 | A1 | 12/2011 | Yamada et al. | |
| 2016/0164258 | A1 | 6/2016 | Weichmann et al. | |
| 2019/0154835 | A1 * | 5/2019 | Maleki | G01S 17/931 |
| 2019/0302262 | A1 | 10/2019 | Singer | |
| 2022/0037848 | A1 | 2/2022 | Behringer et al. | |

FOREIGN PATENT DOCUMENTS

| | | | |
|---|---|---|---|
| CN | 107272217 | A | 10/2017 |
| CN | 108693505 | A | 10/2018 |
| CN | 108761429 | A | 11/2018 |
| CN | 109991622 | A | 7/2019 |
| CN | 109991623 | A | 7/2019 |
| CN | 110456324 | A | 11/2019 |
| DE | 19811032 | A1 | 10/1998 |
| DE | 19948353 | A1 | 4/2001 |
| DE | 10312742 | A1 | 6/2004 |
| DE | 10260183 | A1 | 7/2004 |
| DE | 10313608 | A1 | 10/2004 |
| DE | 102007003832 | A1 | 4/2008 |
| DE | 102007011804 | A1 | 7/2008 |
| DE | 102011085344 | A1 | 7/2013 |
| DE | 102018130560 | A1 | 6/2020 |
| GB | 9505249 | | 9/1995 |
| JP | H11121867 | A | 4/1999 |
| JP | 2004158590 | A | 6/2004 |
| JP | 2013175613 | A | 9/2013 |

OTHER PUBLICATIONS

German Search Report issued for the corresponding German Application No. 10 2019 133 797.6, dated Aug. 6, 2020, 5 pages (for informational purposes only).

G. Hergenhan et al. “Kohaerente Vertikalemitter-Arrays”, Laseropto, 9 pages, dated 2001.

Y. Yuval et al. “Dynamical trapping of light in coupled laser arrays: slow or fast?”, SPIE, dated 2012, 7 pages, vol. 8273, doi: 10.1117/12.914739.

M. Bhattacharya et al. “A Method for Generation of Optical FM Signal Through Injection Locking”, Journal of Lightwave Technology, dated Apr. 1998, pp. 656-660, vol. 16, No. 4.

Chinese office action issued for the corresponding Chinese patent application No. 202080083491.4, dated Jul. 23, 2025, 9 pages (for informational purposes only).

Office Action issued for the German patent application No. 11 2020 006 062.4, dated Jun. 11, 2024, 3 pages (for informational purposes only).

Chinese office action with search report issued for the corresponding Chinese patent application No. 2020800823491.4, dated Mar. 10, 2025, 10 pages (for informational purposes only).

German Office Action issued for the corresponding DE patent application No. DE 11 2020 006 062.4, dated Feb. 2, 2024, 10 pages (For informational purposes only).

Chinese office action issued for the corresponding Chinese patent application No. 202080083491.4, dated Sep. 26, 2025, 10 pages (for informational purposes only).

* cited by examiner

LASER LIGHT SOURCE AND LIDAR SYSTEM COMPRISING THE LASER LIGHT SOURCE

CROSS-REFERENCE TO RELATED APPLICATION

The present application is a national stage entry according to 35 U.S.C. § 371 of PCT application No.: PCT/EP2020/084484 filed on Dec. 3, 2020; which claims priority to German patent application DE 10 2019 133 797.6, filed on Dec. 10, 2019; all of which are incorporated herein by reference in their entirety and for all purposes.

TECHNICAL FIELD

This application is related to laser light sources and LIDAR systems that include said laser light sources.

BACKGROUND

LIDAR systems, in particular FMCW LIDAR ("Frequency Modulated Continuous Wave Light Detection and Ranging") systems, are being used to an increasing extent in vehicles, for example for autonomous driving. For example, they are used for measuring distances or for recognizing objects. In order to be able to reliably detect objects at greater distances, laser light sources with correspondingly high power are required. For this reason, concepts are being developed which enable the available laser power of so-called single-mode lasers, i.e. lasers that emit light of a single wavelength (single mode), to be increased.

An objective is to provide an improved laser light source and an improved LIDAR system.

SUMMARY

According to one embodiment, the object is achieved by the subject matter of the independent claims. Advantageous enhancements are defined in the dependent claims.

A laser light source comprises a first semiconductor laser adapted to emit pump radiation and an array of surface-emitting semiconductor lasers adapted to absorb the pump radiation and emit laser radiation at a frequency of the pump radiation.

The first semiconductor laser may be an edge-emitting laser adapted to emit pump radiation of a single optical mode.

For example, the laser light source may be adapted to emit laser radiation of a single optical mode.

A frequency of the optical mode may be configured to be modulated.

According to embodiments, the array may include more than 100 surface-emitting semiconductor lasers.

The laser light source may further comprise a polarization-rotating element, which is arranged between the first semiconductor laser and a part of the surface-emitting semiconductor laser. According to embodiments, apertures of the surface-emitting semiconductor lasers may be formed in an elliptical shape. For example, the elliptical apertures may be oriented in different directions.

In the laser light source, the laser radiation may have a power of more than 100 mW.

Further embodiments relate to a LIDAR system comprising the laser light source as defined above.

For example, in the LIDAR system, a beam splitter may be arranged between the first semiconductor laser and the array of surface-emitting semiconductor lasers.

BRIEF DESCRIPTION OF THE DRAWINGS

The accompanying drawings serve to provide an understanding of non-limiting embodiments. The drawings illustrate non-limiting embodiments and, together with the description, serve for explanation thereof. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1:
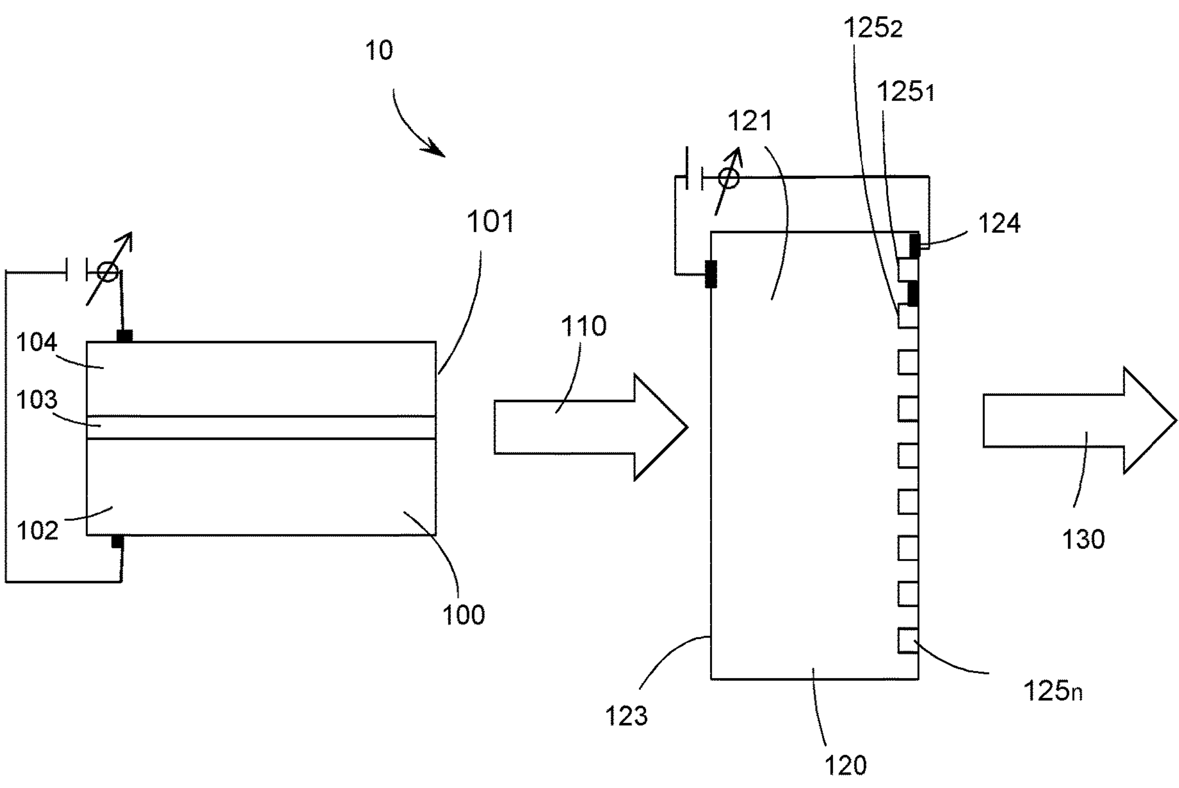
FIG. 1 schematically illustrates the structure of a laser light source according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material, for example a GaAs substrate, a GaN substrate, or an Si substrate, or of an insulating material, for example sapphire. Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInNB, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN, and combinations of the materials mentioned. The stoichiometric ratio of the compound semiconductor materials may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical" as used in this description is intended to describe an orientation which is essentially perpendicular to the first surface of the semiconductor substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1 shows a laser light source 10 according to embodiments. The laser light source 10 comprises a first laser 100 adapted to emit pump radiation 110. Furthermore, the laser light source comprises an array 120 of surface-emitting semiconductor lasers adapted to absorb the pump light 110 and to emit laser light 130. In this manner, the array 120 of surface-emitting lasers may be coherently excited by the pump radiation 110 emitted by the first laser 100 and may emit laser radiation 130, which is strongly amplified compared to the originally emitted pump radiation 110. Accordingly, a semiconductor laser may be provided that is capable of emitting high laser power and yet has a simple and inexpensive structure.

The first laser 100 may be a semiconductor laser, for example. The first semiconductor laser may, for example, comprise a first semiconductor layer 102, for example of a first conductivity type, for example p-type, and a second semiconductor layer of a second conductivity type, for example n-type. An active zone 130 may be arranged between the first semiconductor layer 102 and the second semiconductor layer 104. Laser radiation may be generated in the active zone 103.

The active zone 103 may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures.

The first semiconductor laser 100 may be a so-called edge emitter, in which the laser radiation generated is emitted via a side surface 101, which is perpendicular, for example, to a growth direction of the individual semiconductor layers. By applying an appropriate voltage between the first semiconductor layer 102 and the second semiconductor layer 104 a pump radiation 110 may be generated which is emitted via the surface 101.

The arrangement 120 of surface-emitting semiconductor lasers may be formed, for example, in a substrate 121 which is transparent to the pump radiation 101. A multiplicity of individual surface-emitting semiconductor lasers or VCSELs ("Vertical Cavity Surface-Emitting Laser") $\mathbf{125}_1$, $\mathbf{125}_2$, . . . , $\mathbf{125}_n$ is formed in a first main surface 124 of the substrate 121. The structure of the surface-emitting semiconductor laser is known and is therefore not explained in detail at this point. In particular, in order to produce the surface-emitting semiconductor lasers, layers are applied to form an optical resonator and the active zone over a surface of the substrate 121 that faces away from the second main surface 123. The active zone of the surface-emitting semiconductor laser 125 may be constructed similarly or identically to the active zone of the first semiconductor laser 110.

The pump radiation 110 may, for example, enter the array 120 of surface-emitting semiconductor lasers via the second main surface 123. As a result, laser light 130 is emitted. A voltage is applied to the array 120 of surface-emitting semiconductor lasers such that an operating current is below the threshold current of the array of surface-emitting semiconductor lasers. The voltage is set in such a way that self-emission of the surface-emitting semiconductor laser is prevented. In particular, it is set in such a way that only an induced emission occurs through the so-called injection-locking mechanism.

If the array of surface-emitting semiconductor lasers is then excited by the pump radiation 110, the individual surface-emitting semiconductor lasers $\mathbf{125}_1$, $\mathbf{125}_2$, . . . , $\mathbf{125}_n$ emit laser light at the same wavelength and polarization direction as the irradiated pump radiation 110. Because of the injection-locking mechanism, the same wavelength may be achieved even if the active zone of the array 120 of surface-emitting semiconductor lasers is not entirely identical to the active zone 103 of the first semiconductor laser 100.

For example, the array 120 of surface-emitting semiconductor lasers has more than 10×10 individual emitters, each of which may emit approximately 10 mW, for example. The individual surface-emitting semiconductor lasers may each be identical in structure. According to embodiments, the first semiconductor laser 100 may be a DFB ("Distributed Feedback") or DBR ("Distributed Brack Reflector") laser. This enables emission of a single laser mode by the first semiconductor laser 100 to be achieved. According to embodiments, an emission frequency of the first semiconductor laser 100 may be changed. For example, a frequency modulation may be performed by changing the operating current of the first semiconductor laser 100 in the mA range. The change in the current intensity impressed results in a different refractive index and therefore in a different emission frequency. By controlling the voltage applied to the first semiconductor laser, frequency modulation in a wavelength range of, for example, 10 to 15 nm may be achieved. According to further embodiments, an external frequency modulator, for example a Mach-Zehnder modulator, may also be used. With the frequency of the pump radiation 110 changed, the frequency of the laser radiation 130 emitted by surface-emitting semiconductor lasers changes due to the injection locking effect 120. Depending on the irradiated pump power, the operating current of the array 120 of surface-emitting semiconductor lasers may be suitably set in order to support the emission of the desired laser radiation.

Figure 2A:
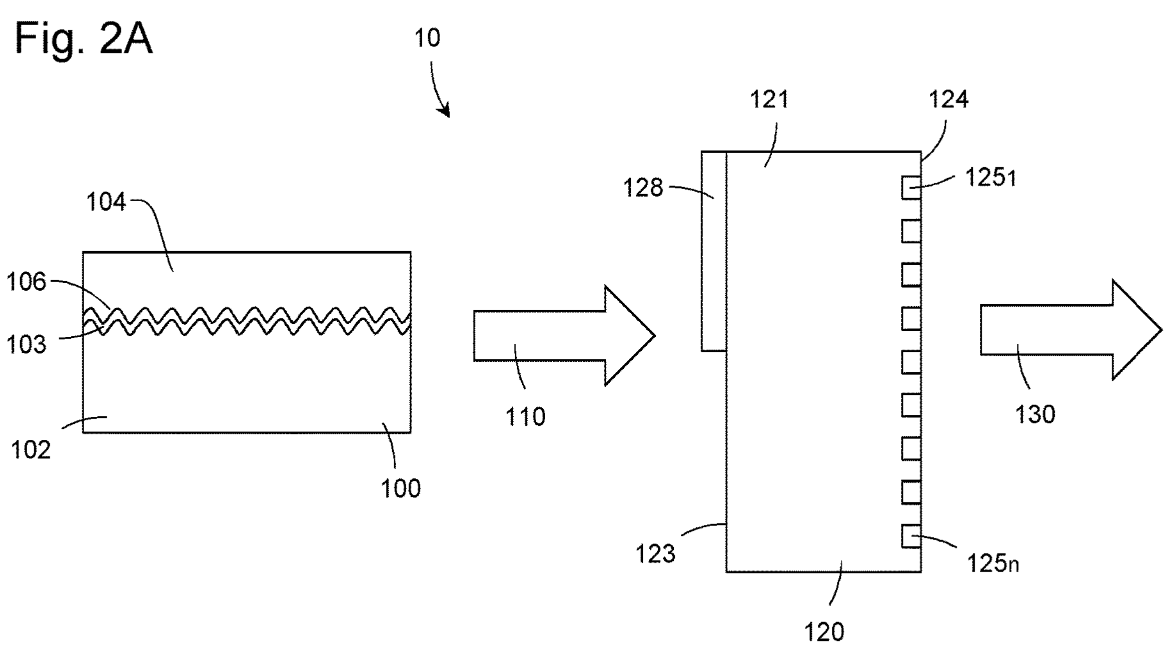
FIG. 2A schematically illustrates the structure of a laser light source according to further embodiments.

FIG. 2A shows a schematic view of a laser light source 10 according to further embodiments. Deviating from the laser light source shown in FIG. 1, the first semiconductor laser 100 is here formed as a DFB or DBR laser. This is indicated by the patterning 106 of the active zone 103.

The laser radiation emitted by a single-mode laser is usually linearly polarized. In general, the individual surface-emitting semiconductor lasers $\mathbf{125}_1$, $\mathbf{125}_2$, . . . , $\mathbf{125}_n$, which are excited with the pump radiation 110, emit in the same polarization direction in which they are excited. On the other hand, objects may reflect in a polarization-selective manner. Accordingly, a measurement result may be falsified in the case of irradiation having a single polarization direction. For this reason, a polarization-changing device, for example a λ/2-plate 128, may be placed in the beam path, so that the polarization direction of linearly polarized light is changed by 90°, for example, for some of the surface-emitting semiconductor lasers $\mathbf{125}_1$, $\mathbf{125}_2$, . . . , $\mathbf{125}_n$, as is illustrated in FIG. 2A.

Figure 2B:
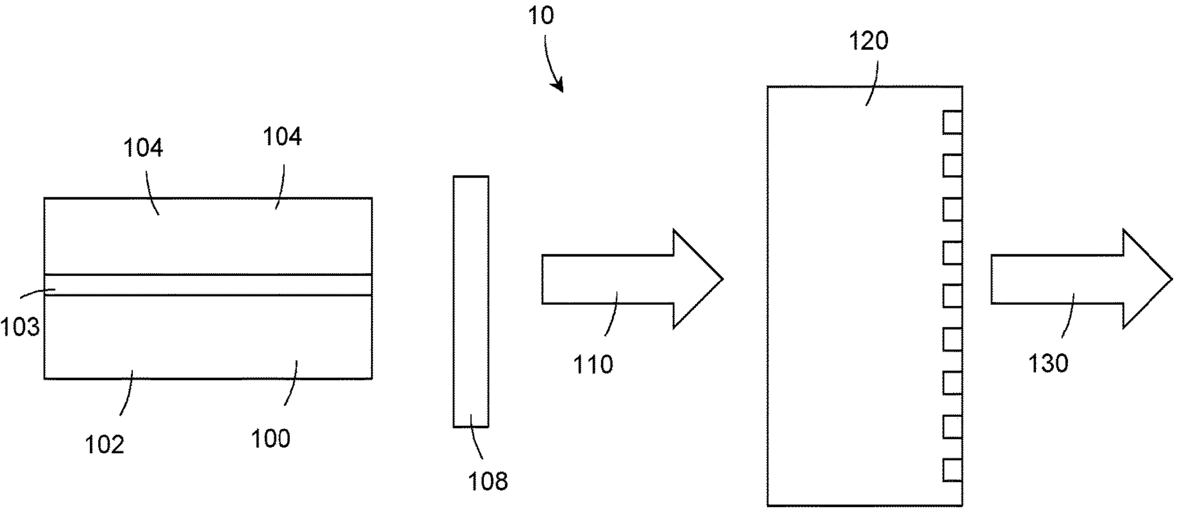
FIG. 2B schematically illustrates the structure of a laser light source according to further embodiments.

FIG. 2B shows a further modification of the laser light source, in which an optical isolator 108 is arranged between the first semiconductor laser 100 and the array 120 of surface-emitting semiconductor lasers. The presence of the optical isolator 108 prevents the laser radiation emitted by the array 120 in the direction of the first semiconductor laser 100 from reaching the first semiconductor laser again and thus influencing it.

Figure 3A:
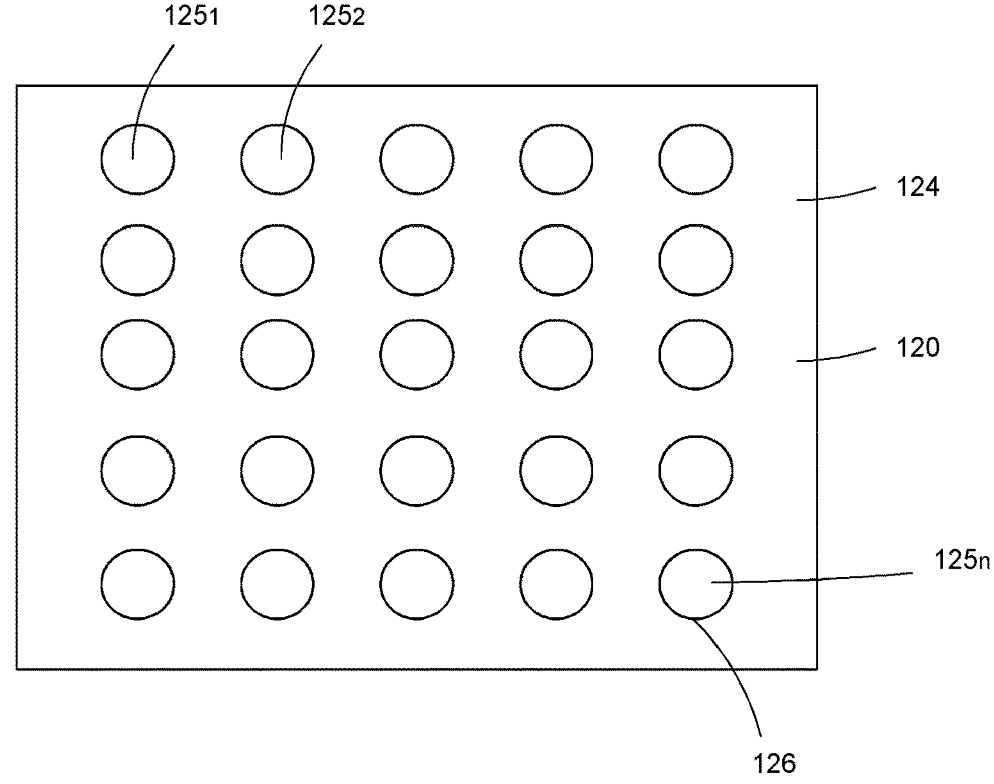
FIG. 3A shows a schematic top view of a laser array according to embodiments.

FIG. 3A shows a plan view of a first main surface 124 of the array 120 of surface-emitting semiconductor lasers $\mathbf{125}_1$, $\mathbf{125}_2$, . . . , $\mathbf{125}_n$. For example, an aperture or opening 126 of the individual surface-emitting semiconductor lasers may be formed to be circular and therefore isotropic.

Figure 3B:
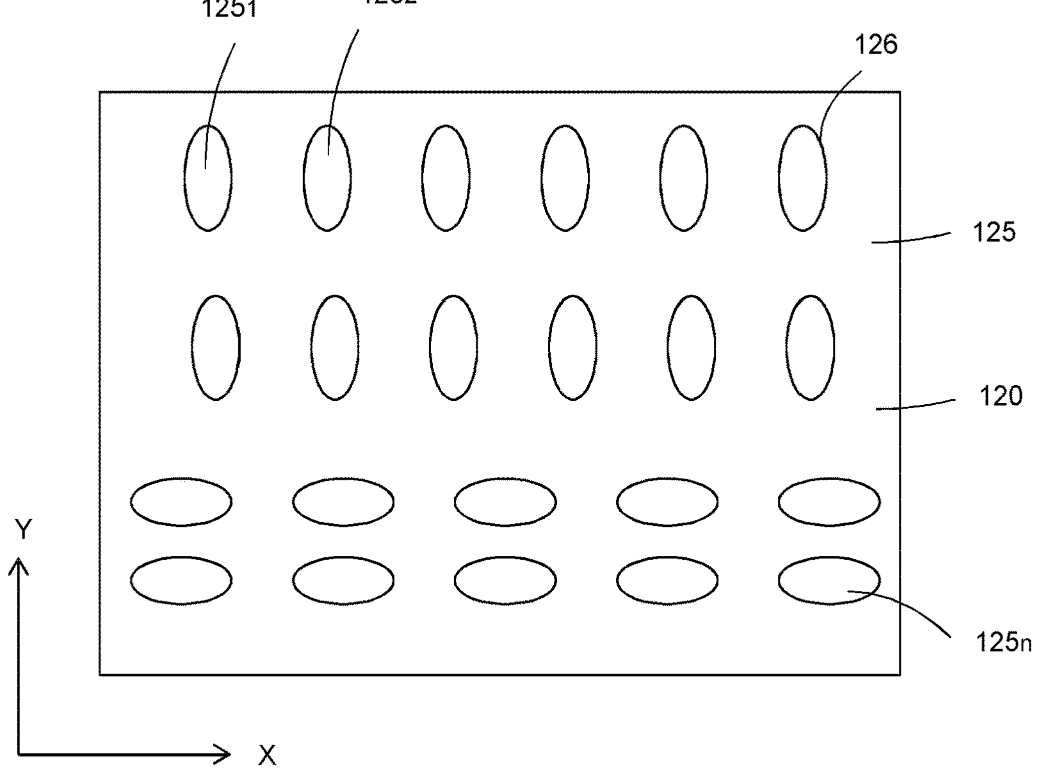
FIG. 3B shows a schematic top view of a laser arrangement according to further embodiments.

As illustrated in FIG. 3B, the aperture 126 may also be formed to be elliptical. As a result, the polarization direction of the emitted laser radiation may be changed with respect to the pump radiation 110. For example, some of the apertures 126 may have an alignment of the ellipses in the X direction. Furthermore, another part of the surface-emitting semiconductor lasers may have an alignment of the apertures in the Y direction. In this manner, the light emitted by the laser light source may have different polarization directions. According to further embodiments, the elliptical apertures may also be aligned randomly. In particular, they may be aligned in directions other than the X or Y directions.

According to embodiments, the array 120 shown in FIG. 3B may also be used together with a polarization-changing device 128, as shown in FIG. 2A. In this case, the polarization-changing device 128 may be placed such that it is arranged in the beam path upstream of surface-emitting semiconductor lasers having a similar alignment of apertures.

Figure 4:
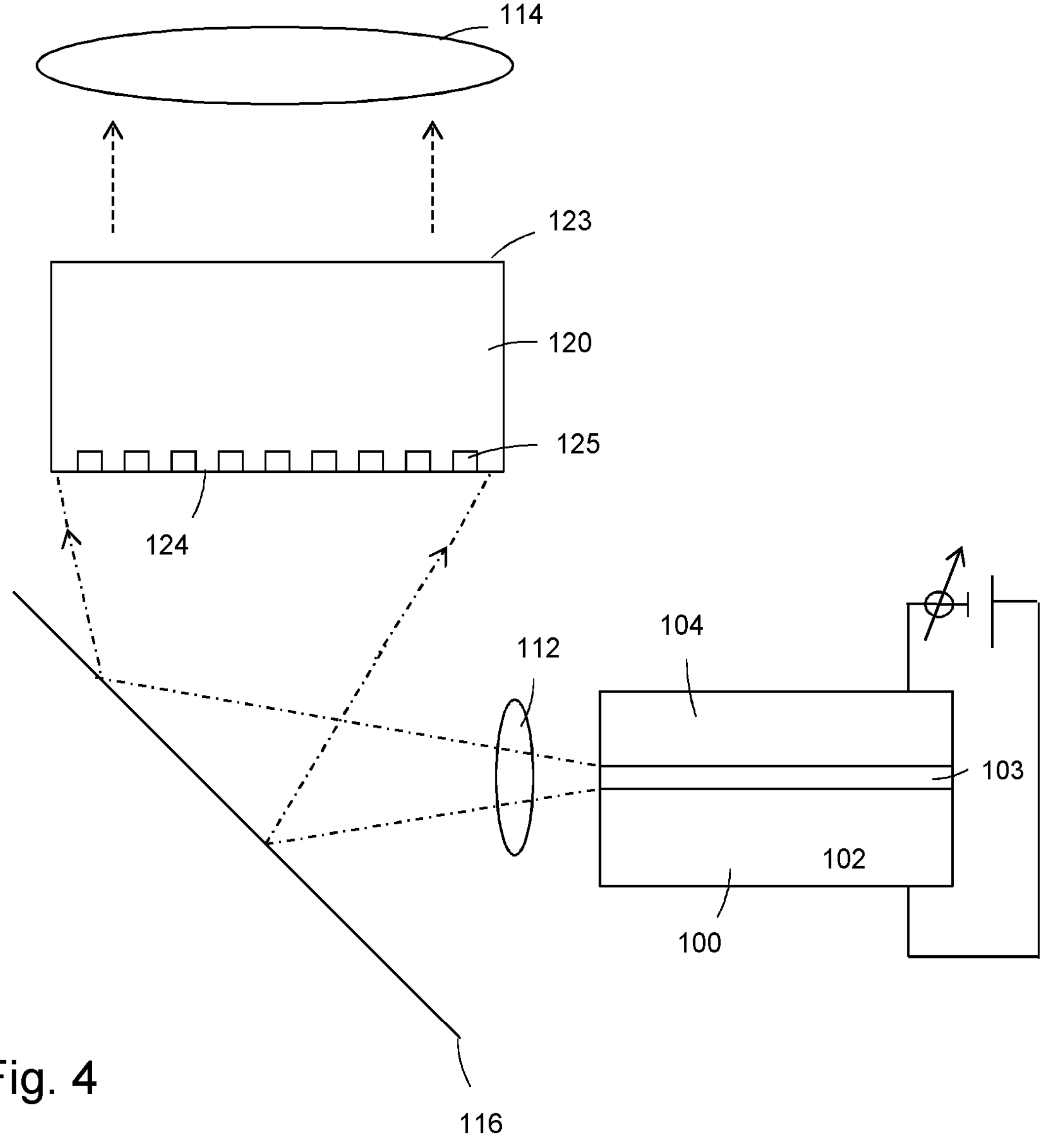
FIG. 4 shows an example of an optical system using the described laser light source.

FIG. 4 shows a schematic view of an optical system comprising the laser light source 10 according to embodiments. The laser light source again comprises the first semiconductor laser 100 and the array 120 of surface-emitting semiconductor lasers. For example, a first optical system 112 may be arranged for effecting beam expansion of the emitted pump radiation 110, for example. Furthermore, a mirror 116 may be provided which deflects the emitted pump radiation 110. In addition, the optical system may have a second optical system 114, which is adapted to change the emitted laser radiation further. For example, the second optical system 114 may comprise a collimator. The laser radiation thus generated may then be further used in a suitable manner and fed to a scanning mirror, for example. As shown in FIG. 4, the generated laser radiation may also be emitted via the second main surface 123 of the substrate 121 in which the array 120 of surface-emitting lasers is formed. That is, the array 120 is arranged such that the first main surface 124 faces the first semiconductor laser 100. In this case, the emitted laser radiation is radiated through substrate 120. The substrate 120 may be a GaAs substrate, for example, and may be transparent to the emitted laser radiation. For example, the pump radiation 110 emitted by the first semiconductor laser 100 and thus the laser radiation emitted by the laser light source may have a wavelength of 940 nm.

Figure 5A:
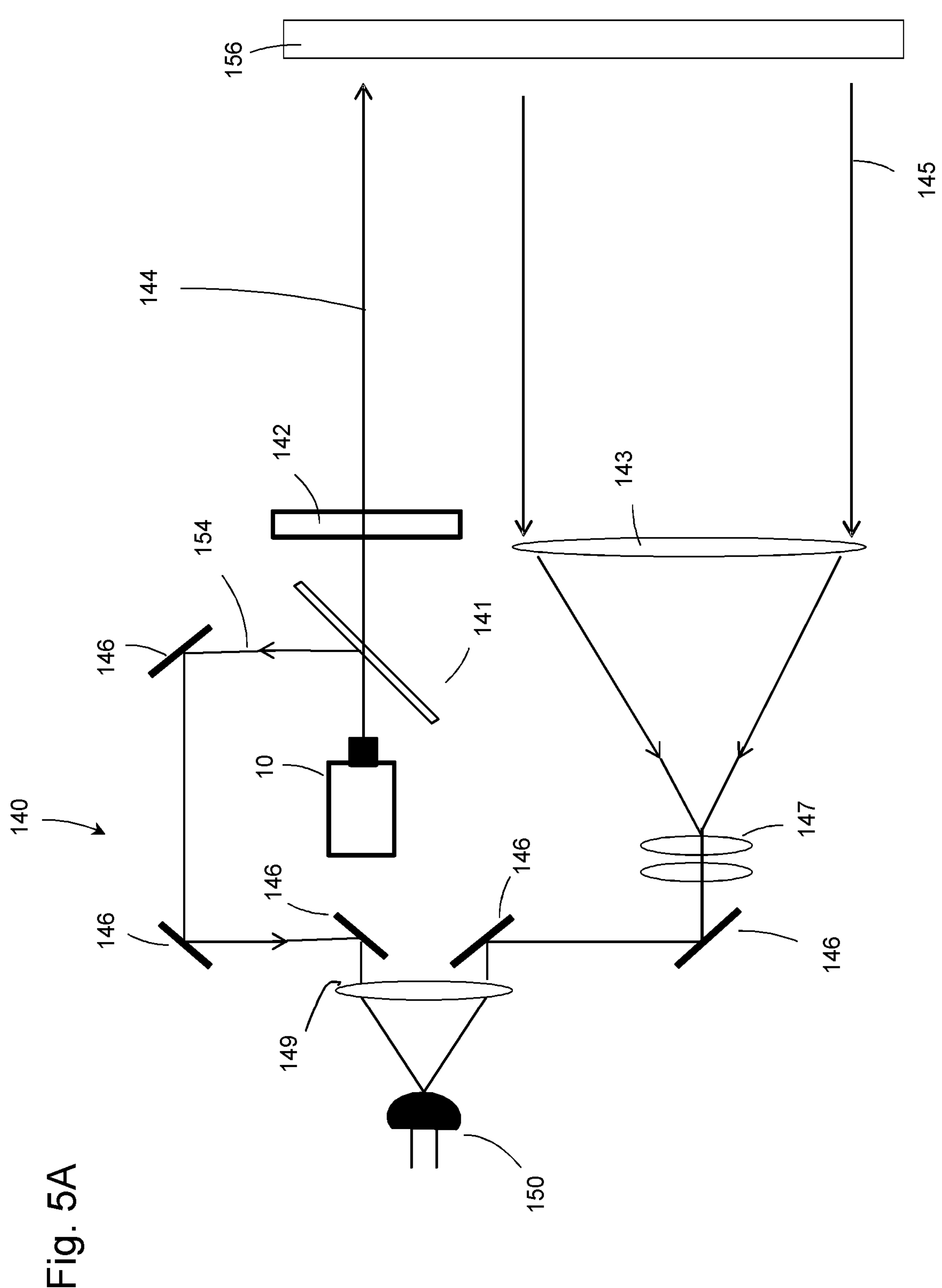
FIG. 5A shows a schematic structure of a LIDAR system according to embodiments.

FIG. 5A shows an example of a LIDAR system, in particular an FMCW LIDAR system, in which the laser light source 10 described may be used. The laser radiation emitted by the laser light source 10 is split by a beam splitter 141 into a reference beam 154 and an object beam 144. The LIDAR system may have a frequency shifter 142, for example, which may shift the emission frequency. As has been described, according to embodiments, frequency modulation may also be performed by changing a frequency emitted by the first semiconductor laser. The object beam is radiated onto an object 156 and reflected by it. This creates the reflected beam 145. The reflected beam 145 is shaped in a suitable manner by receiving optics 143 and a collimator 147 and fed to a detector 150 via mirror 146 and further optics 149. The reference beam 154 is fed directly to the detector 150 via the mirror 146 and the optics 149 without having been reflected by the object 156 beforehand. When the reflected beam 145 is superimposed on the reference beam 154, which are mutually coherent, a signal is produced at the detector from which, for example, the distance and other information about the detected object may be evaluated. Due to the fact that, as described above, a frequency of the emitted pump radiation and thus of the radiation emitted by the laser light source may be modulated, the frequency shifter 142 may be omitted.

Figure 5B:
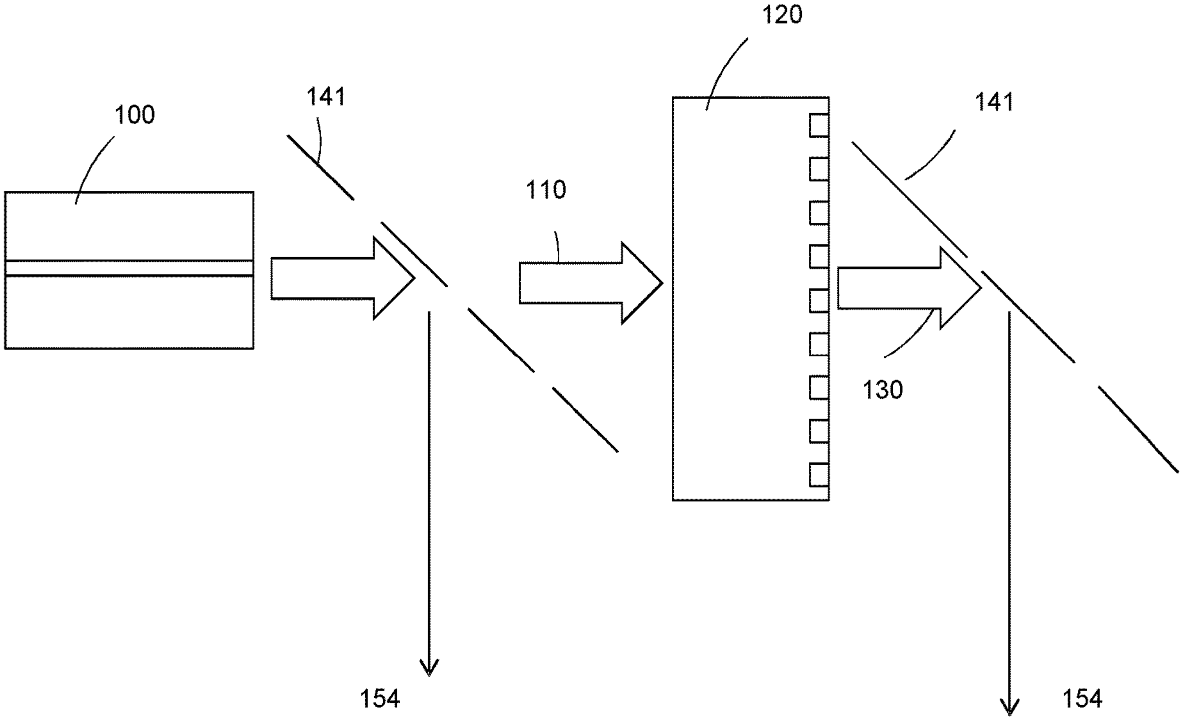
FIG. 5B illustrates a portion of the LIDAR system according to embodiments.

By integrating the laser light source 10 described into the LIDAR system shown in FIG. 5A, the beam splitter 141 may be arranged downstream the array 120 of surface-emitting semiconductor lasers according to one embodiment. According to further embodiments, however, the beam splitter 141 may be arranged directly downstream of the first semiconductor laser 100 and upstream of the array 120 of surface-emitting semiconductor lasers in the direction of radiation. This is illustrated in more detail in FIG. 5B, in which both positions of the beam splitter 141 are exemplified.

As has been described, it is possible to provide a laser light source capable of emitting a single mode at a high output power. At the same time, the laser light source has a compact and inexpensive structure. By changing the frequency of the emitted pump radiation, the frequency emitted by the laser light source may be modulated as well. Due to injection locking, the noise may be reduced.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES

10 laser light source
100 first semiconductor laser
101 side face
102 first semiconductor layer
103 active zone
104 second semiconductor layer
106 patterning
108 optical isolator
110 pump radiation
112 first optical system
114 second optical system
116 mirror
120 VCSEL array
121 substrate
123 second main surface
124 first main surface
$\mathbf{125}_1$, $\mathbf{125}_2$, . . . , $\mathbf{125}_n$ surface-emitting semiconductor laser
126 aperture
128 λ/2-plate
130 laser radiation
140 FMCW system
141 beam splitter
142 frequency shifter
143 receiving optics
144 object beam
145 reflected beam
146 mirror
147 collimator
149 optics
150 detector
154 reference beam
156 object

The invention claimed is:

1. A laser light source comprising:
an edge-emitting first semiconductor laser adapted to emit a first radiation of a single optical mode;
an array of surface-emitting semiconductor lasers;
a first voltage source wherein a voltage below a threshold voltage of the surface-emitting semiconductor lasers is configured to be applied to the array of surface-emitting semiconductor lasers,
wherein the edge-emitting first semiconductor laser is configured to excite the array of surface-emitting semiconductor lasers beyond threshold, the array of surface-emitting semiconductor lasers is adapted to absorb the first radiation and to emit laser radiation at an emission wavelength through an injection-locking mechanism; and
wherein a wavelength of the first radiation and the emission wavelength are configured to be modulated by changing a current intensity impressed in the edge-emitting first semiconductor laser.

2. The laser light source according to claim 1, wherein the array includes more than 100 surface-emitting semiconductor lasers.

3. The laser light source according to claim 1, further comprising a polarization-rotating element arranged between the edge-emitting first semiconductor laser and a part of the surface-emitting semiconductor lasers.

4. The laser light source according to claim 1, wherein apertures of the surface-emitting semiconductor lasers are formed in an elliptical shape.

5. The laser light source according to claim 4, wherein the elliptical apertures are oriented in different directions.

6. The laser light source according to claim 1, wherein the laser radiation has a power greater than 100 mW.

7. The laser light source according to claim 1, further comprising a second voltage source wherein a variable voltage is configured to be applied to the edge-emitting first semiconductor laser, so that the current intensity configured to be impressed in the edge-emitting first semiconductor laser is configured to vary.

8. A LIDAR system comprising:
a laser light source;
wherein the laser light source comprises:
an edge-emitting first semiconductor laser adapted to emit a first radiation of a single optical mode;
an array of surface-emitting semiconductor lasers;
a first voltage source wherein a voltage below a threshold voltage of the surface-emitting semiconductor lasers is configured to be applied to the array of surface-emitting semiconductor lasers,
wherein the edge-emitting first semiconductor laser is configured to excite the array of surface-emitting semiconductor lasers beyond threshold, the array of surface-emitting semiconductor lasers is adapted to absorb the first radiation and to emit laser radiation at an emission wavelength through an injection-locking mechanism,
wherein the wavelength of the first radiation and the emission wavelength are configured to be modulated by changing a current intensity in the edge-emitting first semiconductor laser; and
a second voltage source, wherein a variable voltage is configured to be applied to the edge-emitting first semiconductor laser, so that the current intensity configured to be impressed in the edge-emitting first semiconductor laser is configured to vary.

9. The LIDAR system according to claim 8, wherein a beam splitter is arranged between the edge-emitting first semiconductor laser and the array of surface-emitting semiconductor lasers.

10. The LIDAR system according to claim 8, wherein a beam splitter is arranged on a side of the array of surface-emitting semiconductor lasers facing away from the edge-emitting first semiconductor laser.

* * * * *